United States Patent [19]

Walsh

[11] 4,316,757
[45] Feb. 23, 1982

[54] METHOD AND APPARATUS FOR WAX MOUNTING OF THIN WAFERS FOR POLISHING

[75] Inventor: Robert J. Walsh, Ballwin, Mo.

[73] Assignee: Monsanto Company, St. Louis, Mo.

[21] Appl. No.: 126,807

[22] Filed: Mar. 3, 1980

[51] Int. Cl.³ .............................................. B32B 31/22
[52] U.S. Cl. .................................... 156/286; 156/154; 51/277
[58] Field of Search ............... 51/277, 216 LP, 216 R, 51/281 R; 156/154, 155, 285, 286, 382; 29/580, 559

[56] References Cited

U.S. PATENT DOCUMENTS

| | | | |
|---|---|---|---|
| 3,475,867 | 11/1969 | Walsh | 51/277 |
| 3,492,763 | 2/1970 | Walsh | 51/277 |
| 3,562,965 | 2/1971 | Lange | 51/277 |
| 3,681,171 | 8/1972 | Hojo et al. | 156/382 |
| 3,970,494 | 7/1976 | Pritchard | 156/286 |
| 4,067,764 | 1/1978 | Walker | 156/286 |
| 4,283,242 | 8/1981 | Regler et al. | 156/154 |

Primary Examiner—Roscoe V. Parker
Attorney, Agent, or Firm—Henry Croskell

[57] ABSTRACT

Apparatus and method for wax mounting of thin wafers such as slices of semiconductor silicon to a carrier for polishing wherein the carrier is heated after being coated with wax which is maintained in a sticky condition by the heated carrier. A chamber is utilized for enclosing the thin wafers on resilient supports with the sticky wax-coated, heated carrier disposed above them. The chamber has an air tight seal permitting it to be evacuated. After evacuation a pneumatic cylinder is utilized to press the carrier against the wafers, which adhere to the sticky wax coating. The chamber is vented then to atmospheric pressure, the wafers remaining mounted by the wax coating to the carrier for subsequent polishing. The method avoids entrapment of gas bubbles between wafers and carrier.

16 Claims, 5 Drawing Figures

METHOD AND APPARATUS FOR WAX MOUNTING OF THIN WAFERS FOR POLISHING

BACKGROUND OF THE INVENTION

This invention relates to the processing of thin wafers, such as slices of semiconductor silicon and, more particularly, to improved method and apparatus for mounting of such thin slices on a carrier for performing of mechanical operations thereon, such as polishing of the wafers.

This invention constitutes an improvement of the inventions disclosed and claimed in Walsh U.S. Pat. Nos. 3,475,867 and 3,492,763.

The former discloses a method of wax mounting of semiconductor slices, e.g., silicon to a carrier plate having a flat surface. After the wafers have been mounted on the carrier plate, they are subjected to operations including washing, lapping, polishing, etc. The arrangement disclosed in the latter patent provides for the location of the wafers upon the carrier surface in a uniform arrangement to eliminate deleterious effects of random slice disposition.

When utilizing the methodology as described in the above-identified patents for the wax mounting of silicon wafers to carrier plates for further operations thereon, and particularly polishing to a high degree of surface perfection as appropriate for the manufacture of integrated circuits in such wafers, it has been observed that there is approximately a 10% incidence of air bubble entrapment in the wax layer under the slice, even though entrainment of air bubbles was sought to be avoided by the use of such prior art methodology. Such entrapment is believed to happen when, for example, the concave surface of a wafer which is bowed by virtue of strain therein resulting from sawing or other factors is placed in contact with the sticky wax layer which is first applied to the carrier plate. If the edges of the wafer, or slice, are, in effect "wetted" by the wax before all of the air is forced out from beneath it by the pressure applied against the wafer as it is pressed against the wax coating, then some air remains trapped beneath the slice i.e., between the wafer and adjacent surface of the carrier plate.

Such entrapped air bubbles are a matter of concern when the wafers must be polished to a state of extreme flatness. In the manufacture of very large scale integrated (VLSI) circuits, the density of circuit elements which must be created on a silicon wafer requires an extraordinarily high order of precision and resolution calling for wafer flatness heretofore not required. The necessary polished slice flatness for such applications (less than about 2 micrometers peak-to-valley) cannot be achieved if significant air bubbles are entrapped between a wafer and a carrier and are permitted to remain during polishing. Such bubbles provide a source of pressure tending to bow out a portion of the wafer over the bubble. Accordingly, the pressure exerted by the bubble during polishing results in a region which is polished under slightly greater pressure than portions of the wafer which do not have bubbles therebeneath. Consequently, the polished wafer has regions of thinness after polishing where the bubbles were present.

SUMMARY OF THE INVENTION

It is an object of the invention to provide an improved method of wax mounting of thin wafers to a carrier for further operations thereon, and particularly for wax mounting of slices of semiconductor silicon or other crystalline materials useful in semiconductor and integrated circuit processing to permit polishing thereof.

It is another object of the present invention to provide a method of the character stated for use in wax mounting of such thin wafers and the like so as to substantially avoid the entrapment of air bubbles beneath the wafers.

It is a further object of the present invention to provide a method of the character stated permitting polishing of wafers to an extraordinarily high degree of flatness, such as conducive to the manufacture of VLSI circuits.

It is a still further object of the present invention to provide a method of the character stated which can be practiced simply and easily within the context of large scale, mass production manufacture and processing of wafers of monocrystalline semiconductor silicon and the like.

It is another object of the invention to provide a method of the character stated which can be practiced with a minimum of manual steps and which is amenable to automation.

It is a further object of the invention to provide apparatus for wax mounting of thin wafers of the type stated without entrapment of air bubbles beneath the wafers.

Other objects and features of the invention will be in part apparent and in part pointed out hereinbelow.

BRIEF DESCRIPTION OF THE DRAWINGS

Corresponding reference characters indicate corresponding parts throughout the several views of the drawings.

DESCRIPTION OF THE PREFERRED EMBODIMENTS

Figure 1:
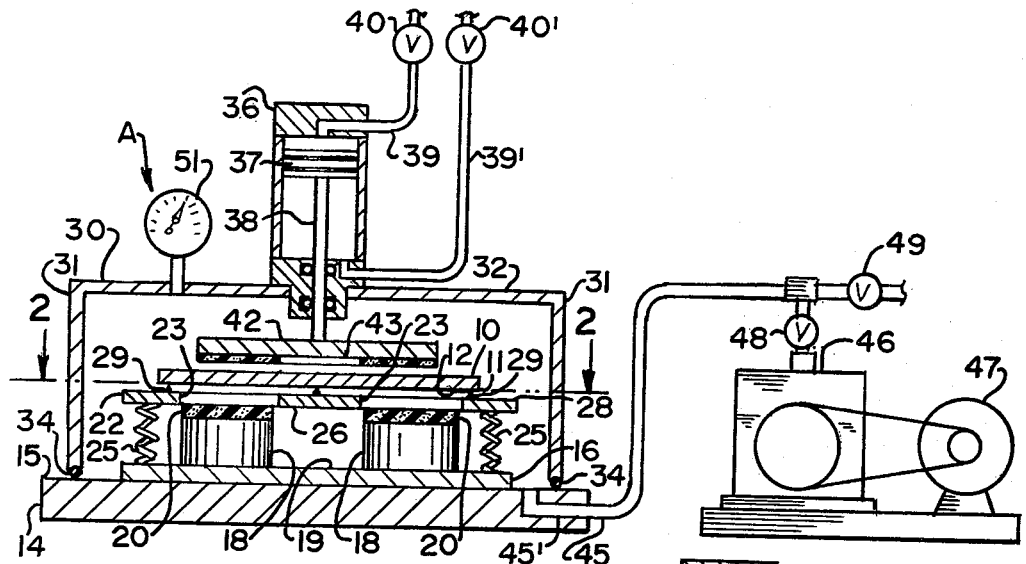
FIG. 1 is a schematic illustration of apparatus, illustrated partly in vertical cross-section, for carrying out a method of wax mounting of thin wafers to a carrier in accordance with the present invention.

Referring to the drawings, designated generally at A is apparatus for carrying out a method of wax mounting of thin wafers, such as so-called slices of monocrystalline semiconductor silicon to be utilized in the manufacture of VSLI circuits. However, wax mounting in accordance with the present invention is suitable for various other thin wafers, such as of germanium, sapphire or other crystalline materials, including garnets as well as various binary, trinary, quaternary, etc., or alloy compositions of rare earth metals and various elements, such as those of atomic groups of I–VII, II–VI or III–V series, or other crystals, compounds or alloys intended for electronics, optics and/or acoustics, etc., applications.

At 10 is designated a metal wafer support plate which is termed a carrier plate or disc-like configuration known in the art and to which it is intended to secure one or a plurality of such thin wafers by removably mounting the same by adherence to a coating 11 of wax upon a flat surface or face 12 of the carrier plate.

Such wax mounting of wafers permits them to be subjected to various processing operations including lapping, washing and, most notably, polishing. If said wafers are monocrystalline silicon slices, which may have a diameter of, for example, 125 mm, such lapping or polishing may be in accordance with Walsh et al., U.S. Pat. No. 3,170,273, to an extraordinarily high degree of surface perfection suitable for making VSLI circuits.

Wax coating 11 is applied in accordance with Walsh U.S. Pat. No. 3,475,867 utilizing a wax as described in Walsh U.S. Pat. No. 3,492,763, both herein incorporated by reference. Briefly, application of the coating is before heating of carrier plate 10 to a predetermined temperature. The wax is dissolved in a volatile solvent and is poured upon the surface 12 of carrier plate (with said surface facing up) while the carrier plate is rotated about its center, thereby to uniformly coat the surface with the wax to establish a reference plane of wax. The wax is maintained in a sticky condition by heat of the carrier plate, which remains heated sufficiently for this purpose while carrying out the new method.

For carrying out the new method, after being coated with wax layer 12, carrier plate 10 is placed within apparatus A with said plate inverted whereby wax coating 11 faces down as illustrated. However, before discussing those aspects of the method which characterize the invention, the features of apparatus A are here described.

A metal base plate 14 of relatively massive, stable character is provided, having a flat, smooth upper face 15 upon which is seated a metal layout plate 16 of disc-like configuration. A plurality of right cylindrical posts 18 spaced at even arcuate intervals around the center of plate 16 are secured to an upper surface or face 19 of plate 16 and extend upwardly therefrom. Each of said posts is identical, each thus having the same length and each being of a diameter which preferably is the same as that of a circular wafer to be wax mounted in accordance with the invention. Posts 18 are not in any event of smaller diameter or smaller cross-sectional area than the wafers to be wax mounted. There are, merely for purposes of illustration, assumed to be four such posts 18 in apparatus A but there may be but one post or several more than illustrated, e.g., six in all.

Secured atop each post 18 is a pad 20 of open-cell foam rubber, each said pad having the same circular cross-section of each post 18 and uniform thickness, e.g., about 13 mm. but being compressible by about 25%, i.e., 3-4 mm. when wafers are pressed against wax coating 11 as described hereinbelow. Hence, each pad 20 is resilient. Each post 18 is, in effect, a wafer pedestal and hence, the posts are referred to hereinbelow as pedestals.

Figure 2:
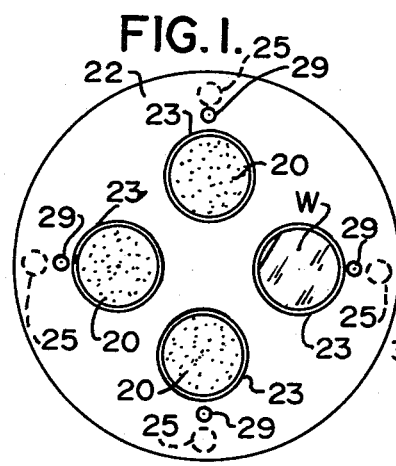
FIG. 2 is a horizontal cross-section taken along line 2—2 of FIG. 1.

Spaced above plate 16 and parallel therewith is a metal template or locator plate 22 of disc-like configuration and provided with a plurality of circular apertures 23 which correspond to pedestals 18 and are coaxial therewith, as shown in FIG. 2. The wafers W, when of silicon, are circular (except for a small crystallographic orientation flat) and typically are of 3 in. (76.2 mm.), 100 mm. or 125 mm. diameter. The circular pads 25 are of corresponding diameter, while the circular apertures 23 are of correspondingly slightly larger (by about 1.25 mm.) diameter.

Template 22 is supported upon a plurality of springs 25 of spring constant sufficient for the springs to support the weight of template 22 and carrier plate 10 such that the upper surface of each of pads 25 will be at or slightly above the level of the lower surface 26 of template 22 whereby circular wafers W (FIG. 3) will be located by apertures 23 and by template 22 in substantial alignment with pedestals 18 with the wafers seated upon pads 20 and thus resiliently supported by the pedestals across their entire surface area of a front face of each wafer as compared with a prior art arrangement supporting each wafer only across a portion (of about one-half to two-thirds of the diameter) of the frontal surface of the wafer.

Carried upon the upper surface 28 of template 22 are a plurality of contact points or pins 29 which may simply be the pointed tips of screws threaded into template 22. Said points 29 are spaced at even intervals around the periphery of the template.

Three of points 29 are shown merely for illustrative purposes, but a lesser or greater number may be used. The purpose of said points 29 is to support carrier plate 10 by engagement of its surface 12 without disturbing wax coating 11 except at the actual point of contact therewith. Carrier plate 10 is thus intended to be supported concentric with, and parallel to, layout plate 16 and template 22 with the sticky wax coating facing the backside of each of the wafers W seated upon pads 20 within apertures 23. By backside is meant the wafer face to be adherent to the carrier so that the opposite face may be lapped, polished, etc., although conceivably the backside itself may previously or subsequently be lapped, polished, etc., or otherwise treated.

Indicated at 30 is an enclosure or cover having four side walls 31 and an upper wall 32 closing the top entirely, said enclosure being open at the bottom but with the side walls all being provided with a continuous O-ring seal 34 along the lower edge and adapted to lie snug against the upper surface 15 of base plate 14. Enclosure 30 is adapted to provide an air tight chamber when seal 34 bears against surface 15. The space of the enclosure is not critical as long as it encloses the various above-described elements.

Carried by the enclosure upper wall 32 is a pneumatic cylinder 36 having a piston 37 therein to which an actuator rod 38 is secured, said cylinder being interconnected by air lines 39, 39' having valves 40, 40' therein for controlling the admission of air under pressure to the cylinder on opposite sides of the piston for movement of the piston either up or down, providing corresponding movement of actuator rod 38.

Cylinder 36 is oriented for movement of actuator rod 38 normal to carrier plate. Carried at the lower end of actuator rod 38 is a circular pressure plate 42 having on its bottom surface a foam pad 43. Said plate 42 is perpendicular to rod 38 and is thus parallel to carrier plate 10, and preferably has diameter less than that of the carrier plate. Pad 43 may be of annular configuration whereby upon lowering of pressure plate 42 by movement of piston 37, pressure can be applied to carrier plate 10 over a cross-sectional area of annular configuration and generally coinciding with the pattern of apertures 23.

Although preventing carrier plate 10 from being damaged by pressure plate 42 and assisting in even distribution of pressure, pad 43 primarily serves to provide thermal insulation between the carrier plate and pressure plate 42 whereby the carrier plate is not cooled by pressure plate 42 when pressed downwardly thereby.

Enclosure 30 is adapted to be raised and lowered manually or by any suitable mechanical arrangement, so as to facilitate use in production line processing of wafers. When lowered in sealing relationship with base plate 14, the enclosure is of sufficient strength and airtight character as to permit evacuation to less than 1 torr (1 mm. Hg pressure). For that purpose, a vacuum line 45 is connected between a passage 45' within base plate 14 and a vacuum pump 46, driven by an electric motor 47, through a valve 48. A further valve 49 is adapted for venting line 45 to atmospheric pressure.

Figure 3:
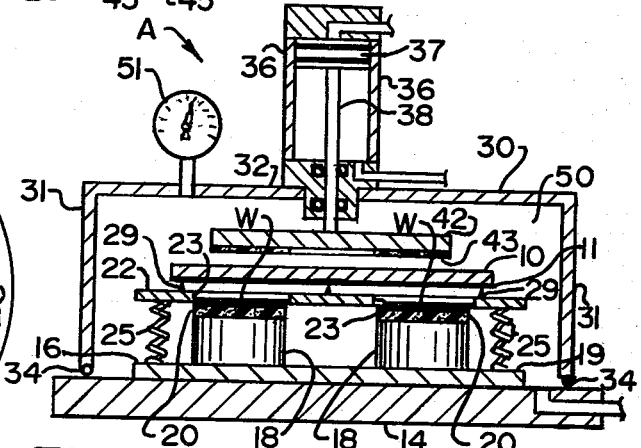
FIGS. 3 and 4 are views similar to FIG. 1 illustrating the apparatus as it is utilized for carrying out certain steps in the operation of the method of the invention.

For carrying out a method of wax mounting of wafers in accordance with the invention, enclosure 30 is opened and wafers W are placed upon the pedestal pads 20 within template apertures 23, as depicted in FIG. 3, by use of a vacuum pencil. The heated, carrier plate 10, which may be a conventional polishing block of stainless steel heated to about 100° C. and having been given wax coating 11 as described in said U.S. Pat. No. 3,475,867, is then immediately placed upon contact points 29, being located as described above, by suitable handling or supporting means (not shown). Enclosure 30 is then lowered upon base plate 14 with seat 34 in sealing contact with surface 15 thereof. Piston 37 is in the position shown in FIG. 3 so that pressure plate 42 is not in contact with carrier plate 10. Valve 49 is then closed and valve 48 is opened. Pump 46 is then operated to evacuate the interior of enclosure 30, which thus defines a vacuum chamber 50 for the carrier plate to a predetermined fraction of normal atmospheric pressure which will eliminate air bubbles beneath the wafers or reduce them to an acceptably insubstantial size or degree.

Broadly, the chamber is evacuated to about 0.1 to about 200 torr, but more narrowly preferred, from about 1-10 torr, as indicated by a suitable gauging device 51. A specific pressure of 1 torr is mot preferred.

While maintaining such relative vacuum, air is admitted to pneumatic cylinder 36 through valve 40 to cause pressure plate 42 to be lowered, by movement of piston 37, against carrier plate 10, the pressure in cylinder 36 being sufficient to cause compression of springs 25. Carrier plate 10 is moved downward by the force by pressure plate 42 until wafers W come in contact with wax coating 11, which remains sticky because of the heat stored in the carrier plate. The force exerted by pressure plate 42 is sufficient to press carrier plate 10, if such is a wafer polishing block, against the wafers, where such are silicon slices as described above, with a force of about 10 lbs./in.$^2$, of slice or wafer area. Such pressure may range from about 2 to about 30 lb/in.$^2$ of wafer area but must in any event be adequate to force or distort the wafers (which may typically have a slightly bowed character resulting from strain during slicing, etc., as previously noted) sufficiently to cause them to assume the flatness of the reference plane established by the wax coating.

Figures 4, 5:
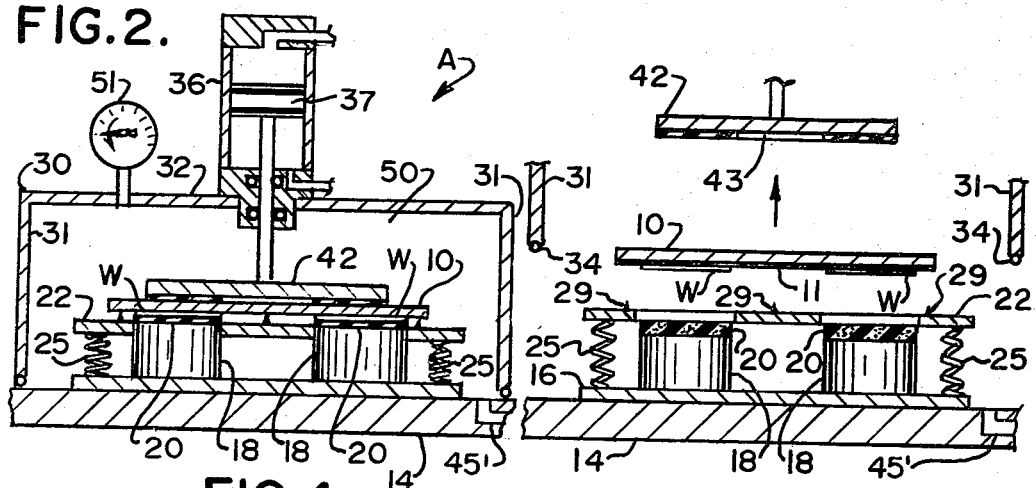
FIG. 5 is a fragmentary view of portions of the apparatus of FIG. 1 and a carrier having wafers wax mounted thereon upon completion of the method of the invention.

At this time, the relationship shown in FIG. 4 obtains, and it is noted that pedestal pads 20 are thus compressed to resiliently seat or mount the wafers upon the wax-coated carrier plate, the slices or wafers W adhering to the sticky wax coating 11 in the manner described in said U.S. Pat. No. 3,475,867, whereby any foreign particles such as dust particles do not interfere with mounting of the wafers.

After maintaining pressure for a brief interval, e.g., preferably about 5 seconds, and more broadly from about .1 to about 10 seconds, air is admitted to pneumatic cylinder 36 through valve 40' to raise pressure plate 42. Valve 48 is closed and valve 49 is opened to vent chamber 50 and return it to normal atmospheric pressure. Enclosure is then lifted. Carrier plate 10 with the now wax-mounted wafers W is then raised, as shown in FIG. 5, by suitable handling or supporting means for being removed and transferred to another position for polishing or other processing of the wafers.

The following example illustrates the results of the invention:

EXAMPLE

Several hundred diamond-sliced, lapped and acid-etched silicon wafers of conventional sizes, 3 in. and 100 mm. diameter, are polished after wax mounting in accordance with the present method and evaluated for P/V (peak-to-valley) flatness by conventional technique. They are compared with identical wafers which are wax-mounted in accordance with the prior art method described in U.S. Pat. No. 3,492,763. The P/V flatness (worst case) results are summarized and compared as follows:

|  | $\overline{X}$ $\mu m$ | 95% ≦ $\mu m$ |
|---|---|---|
| 3 in. wafers |  |  |
| Prior art method | 3.2 | 6.6 |
| Method of invention | 1.3 | 2.0 |
| 100 mm. wafers |  |  |
| Prior art method (simulated) | 4.1 | 6.7 |
| Method of invention | 1.6 | 2.6 |

In the table, $\overline{X}$ refers to the means of all wafers and 95%≦ refers to the maximum P/V flatness value of 95% of the wafers evaluated. By "simulated" is meant that said prior art method of U.S. Pat. No. 3,492,763 is simulated by utilizing apparatus A of the present disclosure to wax-mount the wafers without use of enclosure 30 to establish a relative vacuum and wherein the contacting of wafers W seated upon pedestal pads was effected by use of pressure plate 42. The term P/V flatness is defined as the sum of the greatest positive and negative deviations from a reference plane which approximates the median wafer surface plane when the wafer is mounted on an optically flat vacuum chuck but excluding a small peripheral marginal portion of 1-2 mm. width in order to exclude from the measurement the effect of the desirably edge-rounded character of the wafer.

Although the foregoing includes a description of the best mode contemplated for carrying out the invention, various modifications are contemplated.

As various modifications could be made in the method and constructions herein described and illustrated without departing from the scope of the invention, it is intended that all matter contained in the foregoing description or shown in the accompanying drawings shall be interpreted as illustrative rather than limiting.

What is claimed is:

1. A method of wax mounting of thin wafers to a carrier for polishing, inclusive of applying to a flat surface of said carrier a sticky coating of wax followed by heating said carrier, said method characterized by enclosing at least one thin wafer and said wax-coated carrier in a chamber at normal atmospheric pressure while said wax coating is in said sticky condition, evacuating said chamber, bringing said wafer and wax coating into mutual contact, and subsequently returning said chamber to normal atmospheric pressure, whereby said wafer is mounted by said wax coating to said carrier for subsequent polishing substantially without gas bubble entrapment between said wafer and carrier.

2. A method of wax mounting according to claim 1 further characterized by said evacuating of said chamber being conducted to a predetermined fraction of normal atmospheric pressure of from about 0.1 to about 200 torr.

3. A method of wax mounting according to claim 2 wherein said predetermined fraction is about 1 torr to about 10 torr.

4. A method of wax mounting according to claim 1 further characterized by said bringing said wafer and wax coating into mutual contact being carried out at a pressure of from about 2 to about 30 lb./in.$^2$ of wafer area.

5. A method of wax mounting according to claim 4 wherein said pressure is about 10 lb./in.$^2$ of wafer area.

6. A method of wax mounting according to claim 4 wherein said pressure is maintained for a period of from about 1 to about 10 seconds.

7. A method of wax mounting according to claim 4 further characterized by resiliently supporting said wafer upon a pedestal and, while so supported, said bringing said wafer and wax coating into mutual contact is effected by pneumatically lowering said carrier toward said pedestal within said chamber.

8. A method of wax mounting according to claim 7 wherein said wafer is one of a plurality of wafers and further characterized by resiliently supporting each of said wafers upon respective foam pads atop respective pedestals, said wafers being resiliently supported across the entire area of each wafer.

9. A method of wax mounting according to claim 1 and further characterized by said wafer being a monocrystalline silicon slice.

10. Apparatus for wax mounting of wafers to a carrier for polishing or the like, comprising means for supporting individual wafers with backside surfaces of the wafers presented for being contacted by a flat, wax-coated surface of said carrier, means for supporting said carrier with said wax-coated surface spaced from the backside surfaces of said wafers, and pressure means within an enclosure for pressing said carrier toward said wafers, characterized by said enclosure enclosing said wafer supports, wafers supported thereby, and said carrier, said enclosure being adapted for being made airtight, and means for evacuating said enclosure and maintaining said enclosure in an evacuated state while said wafers are brought into contact with said wax-coated surface.

11. Apparatus according to claim 10 and further characterized by said means for supporting said wafers comprising a plurality of individual wafer supporting means for resiliently supporting the respective wafers substantially entirely across the entire surface area of a front face of each wafer.

12. Apparatus according to claim 11 and further characterized by said wafer supporting means comprising a plurality of pedestals and compressible pads carried atop the respective pedestals, said pads having shape in plan corresponding to said wafers.

13. Apparatus according to claim 12 and further characterized by said wafers being substantially circular, said pads being of circular shape in plan.

14. Apparatus according to claim 13 and further characterized by said pads each comprising a layer of open-cell foam rubber, said wafers each comprising a slice of monocrystalline silicon.

15. Apparatus according to claim 10 and further characterized by said enclosure comprising a base for carrying said wafer supporting means and said carrier supporting means, and a cover being adapted for being raised and lowered with respect to said base, and seal means for establishing an air tight sealing relationship between said cover and base whereby said enclosure may be rendered air tight.

16. Apparatus according to claim 10, said base being horizontal, said pressure means comprising a pressure plate, a pneumatic cylinder and an actuating rod interconnecting said pressure plate and pneumatic cylinder, and further characterized by said pneumatic cylinder being carried by said cover for movement of said pressure plate by said actuating rod vertically toward and away from said base.

* * * * *